United States Patent
Xue et al.

(10) Patent No.: US 10,991,680 B2
(45) Date of Patent: Apr. 27, 2021

(54) COMMON SOURCE LAND GRID ARRAY PACKAGE

(71) Applicant: Alpha and Omega Semiconductor (Cayman), Ltd., Grand Cayman (KY)

(72) Inventors: Yan Xun Xue, Los Gatos, CA (US); Yueh-Se Ho, Sunnyvale, CA (US); Long-Ching Wang, Cupertino, CA (US); Madhur Bobde, Sunnyvale, CA (US); Xiaobin Wang, San Jose, CA (US); Lin Chen, San Jose, CA (US)

(73) Assignee: ALPHA AND OMEGA SEMICONDUCTOR (CAYMAN), LTD., Grand Cayman (KY)

( * ) Notice: Subject to any disclaimer, the term of this patent is extended or adjusted under 35 U.S.C. 154(b) by 0 days.

(21) Appl. No.: 16/575,254

(22) Filed: Sep. 18, 2019

(65) Prior Publication Data

US 2021/0083088 A1    Mar. 18, 2021

(51) Int. Cl.
| | |
|---|---|
| *H01L 25/07* | (2006.01) |
| *H01L 29/78* | (2006.01) |
| *H01L 29/66* | (2006.01) |
| *H01L 23/00* | (2006.01) |

(52) U.S. Cl.
CPC .......... *H01L 25/072* (2013.01); *H01L 24/48* (2013.01); *H01L 29/66712* (2013.01); *H01L 29/7802* (2013.01); *H01L 2924/13091* (2013.01); *H01L 2924/15313* (2013.01)

(58) Field of Classification Search
None
See application file for complete search history.

(56) References Cited

U.S. PATENT DOCUMENTS

| | | | | |
|---|---|---|---|---|
| 8,933,549 B2* | 1/2015 | Liu | .................. | H01L 23/49562 257/676 |
| 9,812,989 B1* | 11/2017 | Dupuis | ................... | H01L 25/50 |
| 2005/0151234 A1* | 7/2005 | Yoshimura | .......... | H01L 23/3128 257/682 |
| 2014/0103512 A1* | 4/2014 | Liu | ........................ | H01L 24/73 257/676 |
| 2018/0096991 A1* | 4/2018 | Nasu | ..................... | H01L 27/088 |
| 2020/0194405 A1* | 6/2020 | Koyanagi | ............. | H05K 1/181 |

FOREIGN PATENT DOCUMENTS

JP         2013026316 A  *  2/2013  ....................... 24/33

* cited by examiner

*Primary Examiner* — J. E. Schoenholtz
(74) *Attorney, Agent, or Firm* — Chen-Chi Lin

(57) ABSTRACT

A semiconductor package comprises a land grid array substrate, a first VDMOSFET, a second VDMOSFET, and a molding encapsulation. The land grid array substrate comprises a first metal layer, a second metal layer, a third metal layer, a plurality of vias, and a resin. A series of drain pads at a bottom surface of the semiconductor package follow a "drain 1, drain 2, drain 1, and drain 2" pattern. A method for fabricating a semiconductor package. The method comprises the steps of providing a land grid array substrate; mounting a first VDMOSFET and a second VDMOSFET on the land grid array substrate; applying a wire bonding process; forming a molding encapsulation; and applying a singulation process.

17 Claims, 8 Drawing Sheets

US 10,991,680 B2

COMMON SOURCE LAND GRID ARRAY PACKAGE

FIELD OF THE INVENTION

This invention relates generally to a semiconductor package and a method of making the same. More particularly, the present invention relates to a semiconductor having a land grid array for a common source configuration.

BACKGROUND OF THE INVENTION

In cell phone charging application a bidirectional semiconductor switch having a common source configuration is often controlled by an integrated circuit controller to provide over voltage protection. Conventional technology uses dual channel lateral double-diffused metal-oxide semiconductor transistor (LDMOS) structure to provide alternating drain contact pattern for external electrical connection. Although the conventional lateral device technology provides the convenience to integrate two LDMOS on a single chip, it takes large semiconductor area because the channel is form laterally. The present disclosure uses a first vertical double-diffused metal-oxide semiconductor field-effect transistor (VDMOSFET) chip, a second VDMOSFET chip, and a land grid array having three separated metal layers to achieve an alternating drain contacts pattern for external electrical connection. Since the channel of a vertical device is formed vertically, the combined semiconductor area of two chips could be reduced.

In the present disclosure, two N-channel VDMOSFET chips and a three-layer land grid array substrate are co-packed in a single package. The first layer is for die bonding purpose. The second layer is for drain traces routing purpose. The third layer is for external electrical connection purpose.

SUMMARY OF THE INVENTION

The present invention discloses a semiconductor package comprising a land grid array substrate, a first VDMOSFET chip, a second VDMOSFET chip, and a molding encapsulation. The land grid array substrate comprises a first metal layer, a second metal layer, a third metal layer, a plurality of vias, and a resin. A series of drain pads at a bottom surface of the semiconductor package configure an alternating drain contacts pattern.

A method for fabricating a semiconductor package is also disclosed. The method comprises the steps of providing a land grid array substrate; mounting a first VDMOSFET chip and a second VDMOSFET chip on the land grid array substrate; applying a wire bonding process; forming a molding encapsulation; and applying a singulation process.

DETAILED DESCRIPTION OF THE INVENTION

Figure 1A:
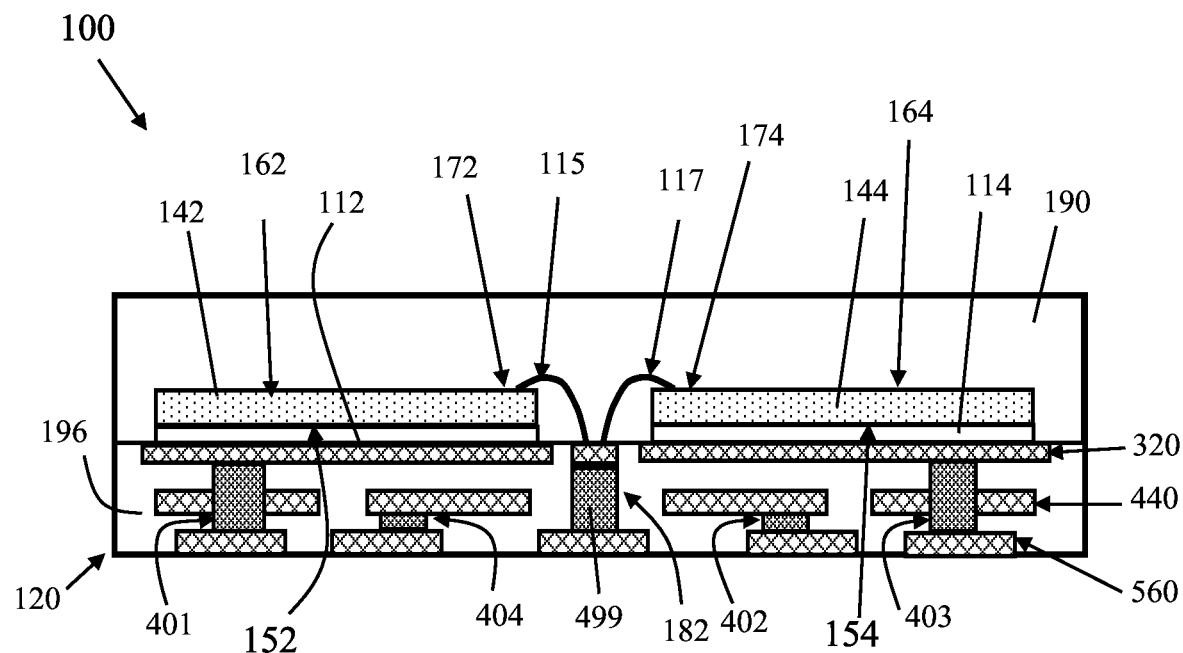
FIGS. 1A and 1B are cross sectional plots of a semiconductor package in examples of the present disclosure.
Figure 1B:
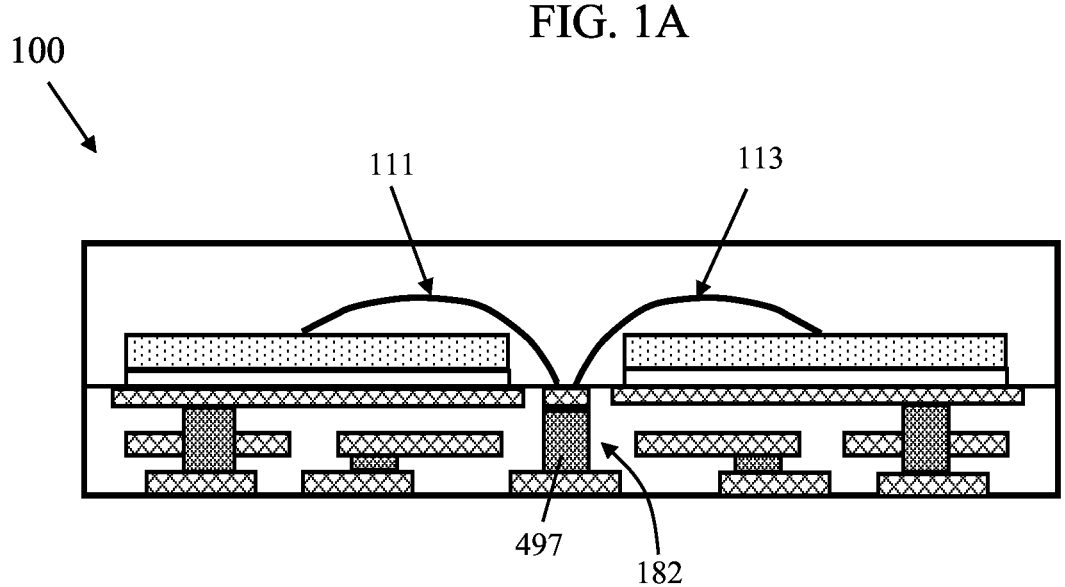
Figure 3:
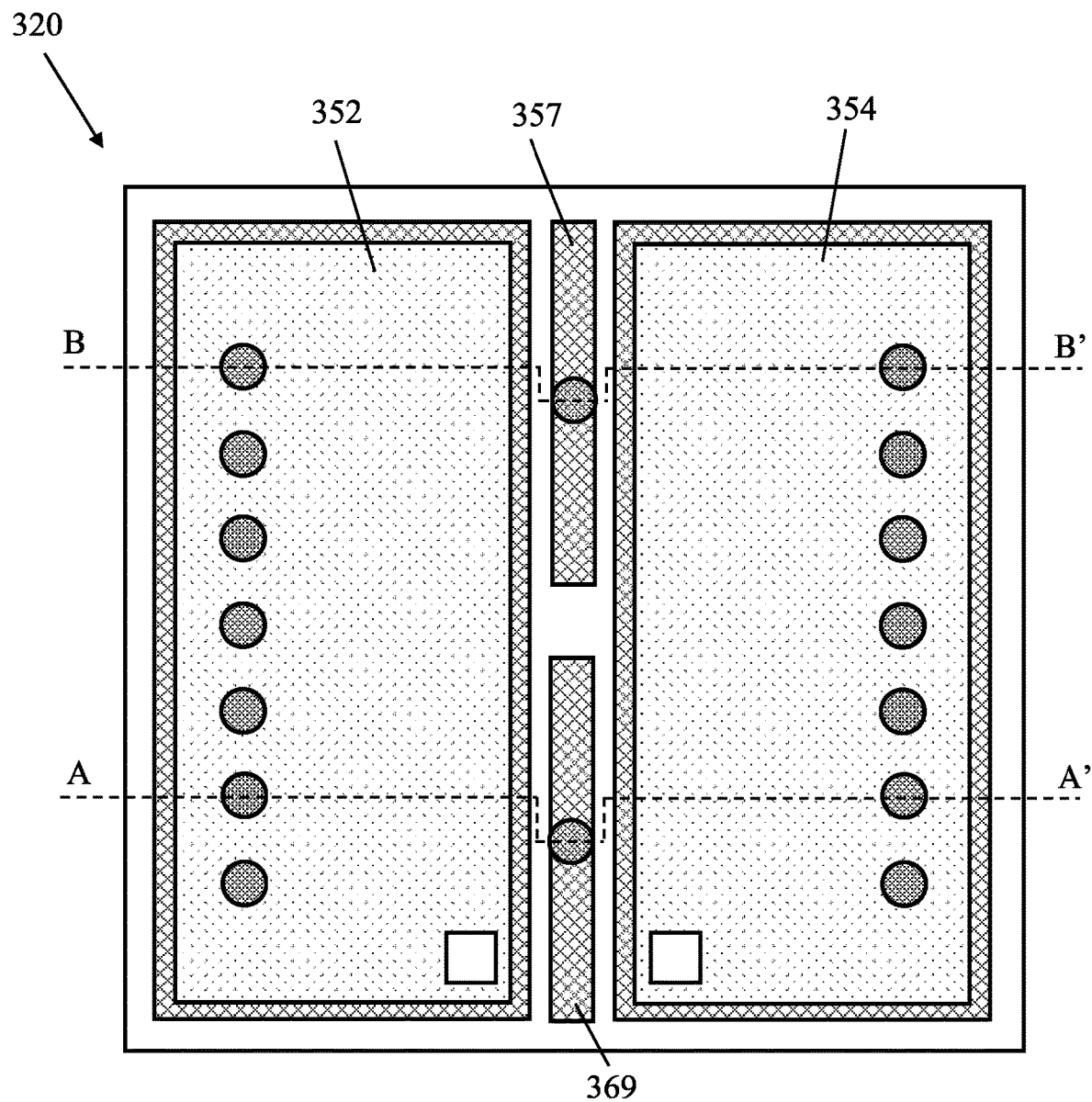
FIG. 3 is a top view of a first metal layer of a land grid array substrate in examples of the present disclosure.

FIG. 1A is a cross sectional plot along AA' of FIG. 3 and FIG. 1B is a cross sectional plot along BB' of FIG. 3 of a semiconductor package 100 in examples of the present disclosure. The semiconductor package 100 comprises a land grid array substrate 120, a first VDMOSFET chip 142, a second VDMOSFET chip 144, and a molding encapsulation 190. The land grid array substrate 120 comprises a first metal layer 320, a second metal layer 440, a third metal layer 560, a plurality of vias 182, and a resin 196. The resin 196 encloses a majority portion of the first metal layer 320, the second metal layer 440, a majority portion of the third metal layer 560, and a majority portion of the plurality of vias 182. The molding encapsulation 190 encloses the first VDMOSFET chip 142, and the second VDMOSFET chip 144. A bottom surface of the molding encapsulation 190 is directly attached to a top surface of the resin 196.

In examples of the present disclosure, a top surface of the first metal layer 320 is coplanar. A bottom surface of the first metal layer 320 is coplanar. A top surface of the second metal layer 440 is coplanar. A bottom surface of the second metal layer 440 is coplanar. A top surface of the third metal layer 560 is coplanar. A bottom surface of the third metal layer 560 is coplanar. The second metal layer 440 is between the first metal layer 320 and the third metal layer 560. In examples of the present disclosure, the first metal layer 320 is separated from the second metal layer 440 by a portion of the resin 196. The second metal layer 440 is separated from the third metal layer 560 by another portion of the resin 196.

The first VDMOSFET chip 142 comprises a drain electrode 152 located at a bottom surface of the first VDMOSFET chip 142. The first VDMOSFET chip 142 further comprises a source electrode 162 and a gate electrode 172 located at a top surface of the first VDMOSFET chip 142. The second VDMOSFET chip 144 comprises a drain electrode 154 located at a bottom surface of the second VDMOSFET chip 144. The second VDMOSFET chip 144 further comprises a source electrode 164 and a gate electrode 174 located at a top surface of the second VDMOSFET chip 144.

Figure 2:
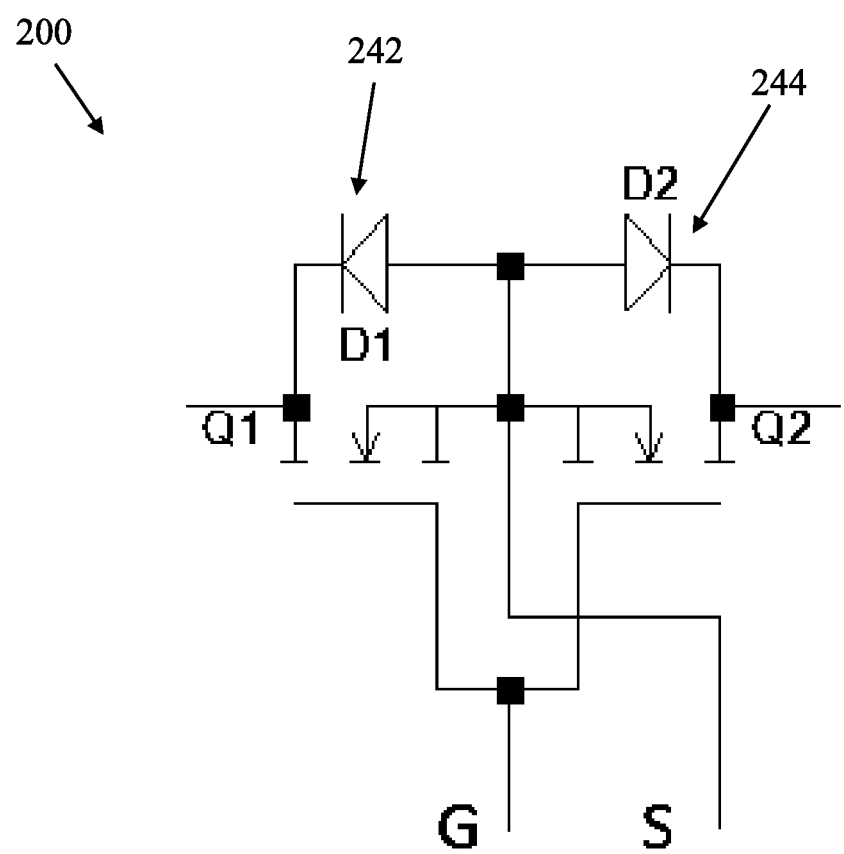
FIG. 2 is a circuit having a common source configuration in examples of the present disclosure.

FIG. 2 is a circuit 200 having a common source configuration in examples of the present disclosure. A first VDMOSFET chip 242 and a second VDMOSFET chip 244 have a common source configuration.

FIG. 3 is a top view of a first metal layer 320 of a land grid array substrate 120 in examples of the present disclosure. The first metal layer 320 comprises a first metal pad 352, a second metal pad 354, a source pad 357, and a gate pad 369. Referring now to FIGS. 1 and 3, the drain electrode 152 of the first VDMOSFET chip 142 is attached to the first metal pad 352 of the first metal layer 320 by a first conductive adhesive 112. The drain electrode 154 of the second VDMOSFET chip 144 is attached to the second metal pad 354 of the first metal layer 320 by a second conductive adhesive 114. In one example, the first conductive adhesive 112 and the second conductive adhesive 114 are made of a solder paste material. In another example, the first conductive adhesive 112 and the second conductive adhesive 114 comprise a power metallurgy material. In still another example, the first conductive adhesive 112 and the second conductive adhesive 114 comprise an elastomer material. In yet still another example, the first conductive adhesive 112 and the second conductive adhesive 114 comprise an epoxy material.

In examples of the present disclosure, the first metal pad 352 is of a rectangular shape. The second metal pad 354 is of a rectangular shape. The source pad 357 is of a rectangular shape. The gate pad 369 is of a rectangular shape.

Referring now to FIGS. 1A, 1B, and 3, the source electrode 162 of the first VDMOSFET chip 142 is electrically and mechanically connected to the source pad 357 of the first metal layer 320 by a bonding wire 111. The gate electrode 172 of the first VDMOSFET chip 142 is electrically and mechanically connected to the gate pad 369 of the first metal layer 320 by a bonding wire 115. The source electrode 164 of the second VDMOSFET chip 144 is electrically and mechanically connected to the source pad 357 of the first metal layer 320 by a bonding wire 113. The gate electrode 174 of the second VDMOSFET chip 144 is electrically and mechanically connected to the gate pad 369 of the first metal layer 320 by a bonding wire 117.

Figure 4:
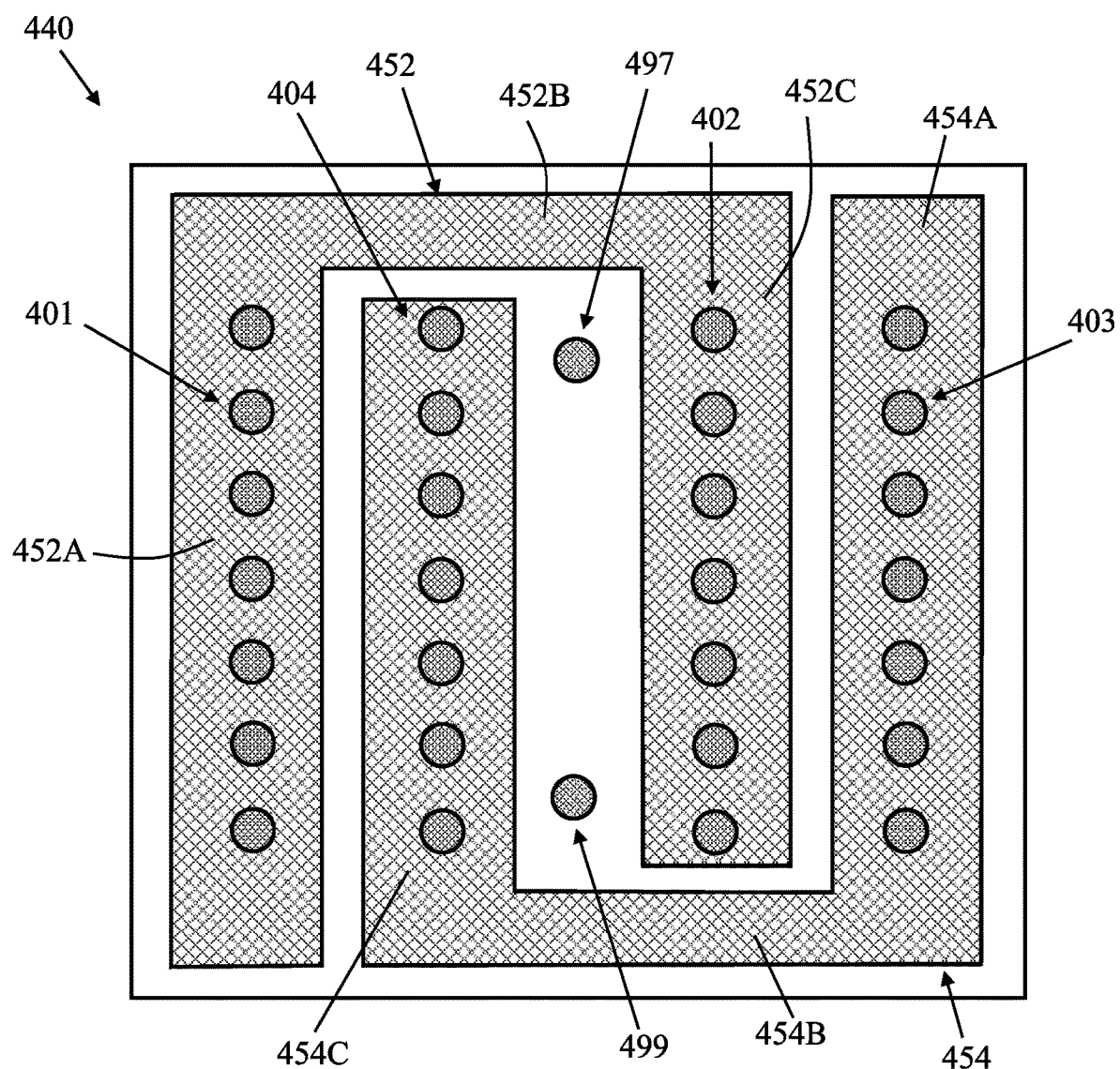
FIG. 4 is a top view of a second metal layer of a land grid array substrate in examples of the present disclosure.

FIG. 4 is a top view of a second metal layer 440 of a land grid array substrate 120 in examples of the present disclosure. The second layer comprises a first letter U shaped pad 452 and a second letter U shaped pad 454. The first letter U shaped pad 452 comprises a first leg 452A, a second leg 452B, and a third leg 452C. The first leg 452A is perpendicular to the second leg 452B. The second leg 452B is perpendicular to the third leg 452C. The second letter U shaped pad 454 comprises a first leg 454A, a second leg 454B, and a third leg 454C. The first leg 454A is perpendicular to the second leg 454B. The second leg 454B is perpendicular to the third leg 454C. The third leg 454C of the second letter U shaped pad 454 is between the first leg 452A of the first letter U shaped pad 452 and the third leg 452C of the first letter U shaped pad 452. The third leg 452C of the first letter U shaped pad 452 is between the first leg 454A of the second letter U shaped pad 454 and the third leg 454C of the second letter U shaped pad 454.

In examples of the present disclosure, a length of the third leg 452C of the first letter U shaped pad 452 is shorter than a length of the first leg 452A of the first letter U shaped pad 452 because the third leg 452C of the first letter U shaped pad 452 is disposed in the opening of the second letter U shaped pad 454. A length of the third leg 454C of the second letter U shaped pad 454 is shorter than a length of the first leg 454A of the second letter U shaped pad 454 because the third leg 454C of the second letter U shaped pad 454 is disposed in the opening of the first letter U shaped pad 452.

One or more source vias 497 are between the third leg 452C of the first letter U shaped pad 452 and the third leg 454C of the second letter U shaped pad 454. One or more gate vias 499 are between the third leg 452C of the first letter U shaped pad 452 and the third leg 454C of the second letter U shaped pad 454.

In examples of the present disclosure, the first plurality of vias 401 are equally spaced, distributed along the first leg 452A of the first letter U shaped pad 452. The second plurality of vias 402 are equally spaced, distributed along the third leg 452C of the first letter U shaped pad 452. The third plurality of vias 403 are equally spaced, distributed along the first leg 454A of the second letter U shaped pad 454. The fourth plurality of vias 404 are equally spaced, distributed along the third leg 454C of the second letter U shaped pad 454. In examples of the present disclosure, no vias are disposed along the second leg 452B of the first letter U shaped pad 452. In examples of the present disclosure, no vias are disposed along the second leg 454B of the second letter U shaped pad 454.

In examples of the present disclosure, the second metal layer 440 forms a rotational symmetry of order 2. The first letter U shaped pad 452 and the second letter U shaped pad 454 (including holes to receive the first plurality of vias 401, the second plurality of vias 402, the third plurality of vias 403, and the fourth plurality of vias 404) forms a rotational symmetry of order 2. In examples of the present disclosure, the first letter U shaped pad 452 and the second letter U shaped pad 454 have a same size (a same surface area and a same thickness).

Figure 5:
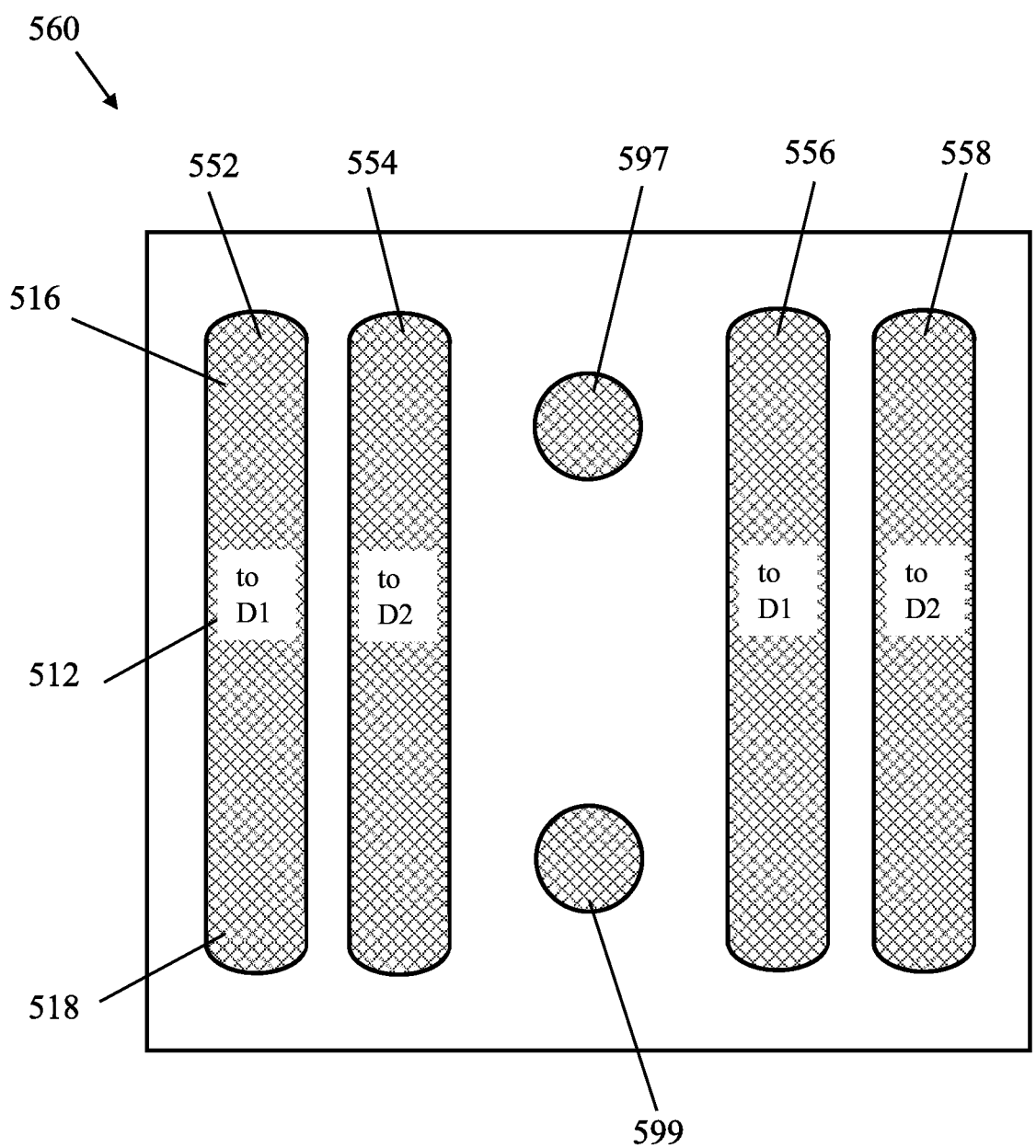
FIG. 5 is a bottom view of a third metal layer of a land grid array substrate in examples of the present disclosure.

Referring now to FIGS. 3, 4 and 5, the source pad 357 of the first metal layer 320 and the source pad 597 of the third metal layer 560 are connected by the one or more source vias 497. The gate pad 369 of the first metal layer 320 and the gate pad 599 of the third metal layer 560 are connected by the one or more gate vias 499.

In examples of the present disclosure, a bottom surface of the source pad 597 of the third metal layer 560 is of a circular shape. A bottom surface of the gate pad 599 of the third metal layer 560 is of the circular shape.

FIG. 5 is a bottom view of a third metal layer 560 of a land grid array substrate 120 in examples of the present disclosure. FIG. 5 is also a bottom view of the semiconductor package 100. The third metal layer 560 comprises the source pad 597, the gate pad 599, a first drain pad 552 configured to be electronically connected to the drain electrode 152 of the first VDMOSFET chip 142 (to D1), a second drain pad 554 configured to be electronically connected to the drain electrode 154 of the second VDMOSFET chip 144 (to D2), a third drain pad 556 configured to be electronically connected to the drain electrode 152 of the first VDMOSFET chip 142 (to D1), and a fourth drain pad 558 configured to be electronically connected to the drain electrode 154 of the second VDMOSFET chip 144 (to D2). In examples of the present disclosure, "to D1" and "to D2" follow an alternating pattern. "to D1" followed by "to D2" followed by "to D1", and then followed by "to D2".

The second drain pad 554 is between the first drain pad 552 and the third drain pad 556. The third drain pad 556 is between the second drain pad 554 and the fourth drain pad 558. The source pad 597 of the third metal layer 560 is between the second drain pad 554 and the third drain pad 556. The gate pad 599 of the third metal layer 560 is between the second drain pad 554 and the third drain pad 556.

In examples of the present disclosure, the first drain pad 552, the second drain pad 554, the third drain pad 556, and the fourth drain pad 558 have a same size (a same surface area and a same thickness). The top surface of each of the first drain pad 552, the second drain pad 554, the third drain pad 556, and the fourth drain pad 558 comprises a rectangular shape 512 with two semi-circles 516 and 518 at two opposite ends of the rectangular shape respectively.

Referring now to FIGS. 1A, 1B, 3, 4 and 5, the first metal pad 352 of the first metal layer 320, the first letter U shaped pad 452 of the second metal layer 440, and the first drain pad 552 of the third metal layer 560 are connected by a first plurality of vias 401. The first letter U shaped pad 452 of the second metal layer 440 and the third drain pad 556 of the third metal layer 560 are connected by a second plurality of vias 402. The second metal pad 354 of the first metal layer 320, the second letter U shaped pad 454 of the second metal layer 440, and the fourth drain pad 558 of the third metal layer 560 are connected by a third plurality of vias 403. The second letter U shaped pad 454 of the second metal layer 440 and the second drain pad 554 of the third metal layer 560 are connected by a fourth plurality of vias 404.

In examples of the present disclosure, the first plurality of vias 401 is perpendicular to the first metal layer 320. The first plurality of vias 401 is perpendicular to the second metal layer 440. The first plurality of vias 401 is perpendicular to the third metal layer 560. The second plurality of vias 402 is perpendicular to the first metal layer 320. The third plurality of vias 403 is perpendicular to the first metal layer 320. The fourth plurality of vias 404 is perpendicular to the first metal layer 320.

In examples of the present disclosure, the first metal layer 320, the second metal layer 440, and the third metal layer 560 are made of a copper material. The resin 196 is made of an FR4 material or a polyimide material. The plurality of vias 182 are conductive containing copper.

Figure 6:
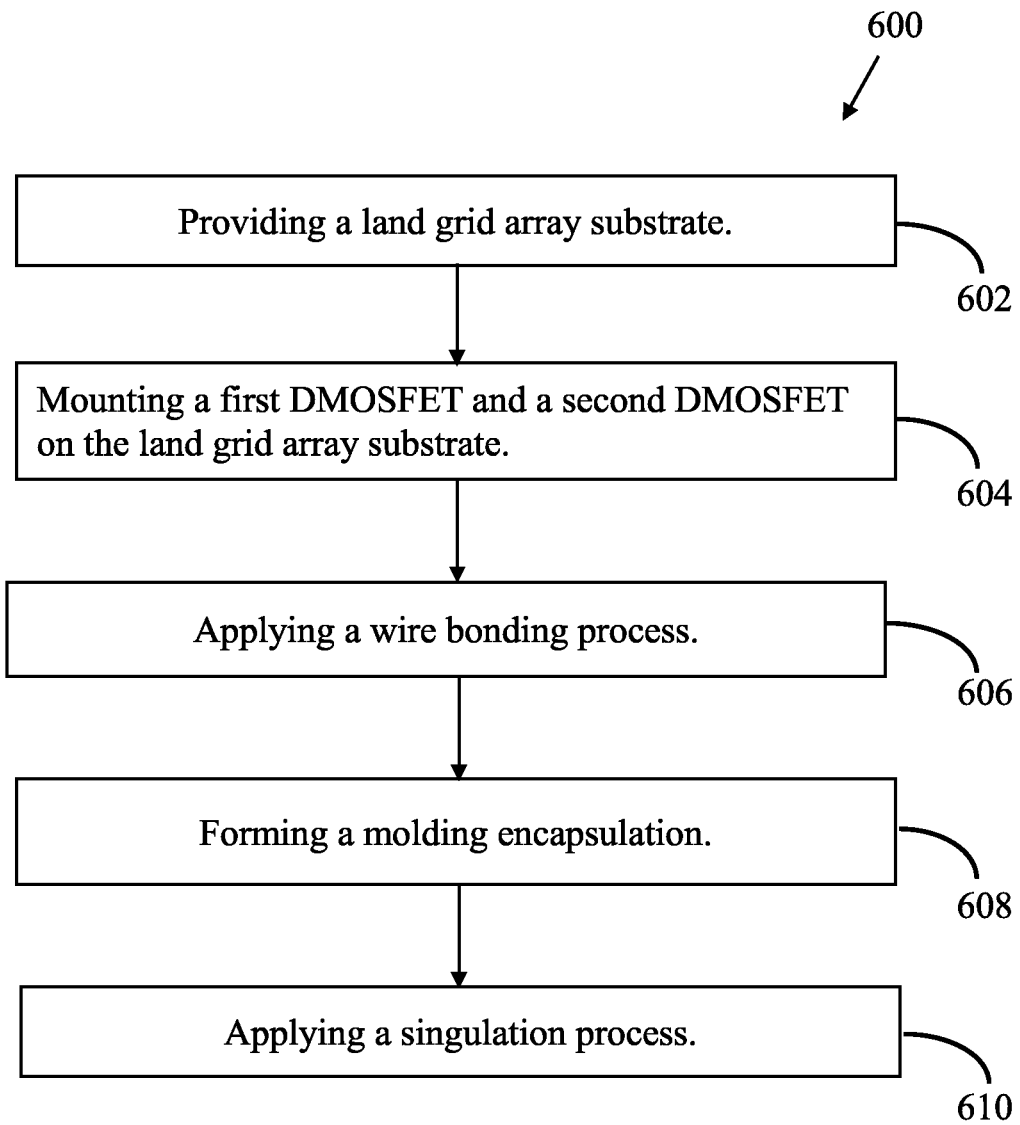
FIG. 6 is a flowchart of a process to develop a power semiconductor package in examples of the present disclosure.

FIG. 6 is a flowchart of a process 600 to develop a power semiconductor package in examples of the present disclosure. The process 600 may start from block 602. For simplicity, the right one in dashed lines of FIG. 10 (same structure as the corresponding left one in solid lines) is not shown in FIGS. 7, 8 and 9.

Figure 7:
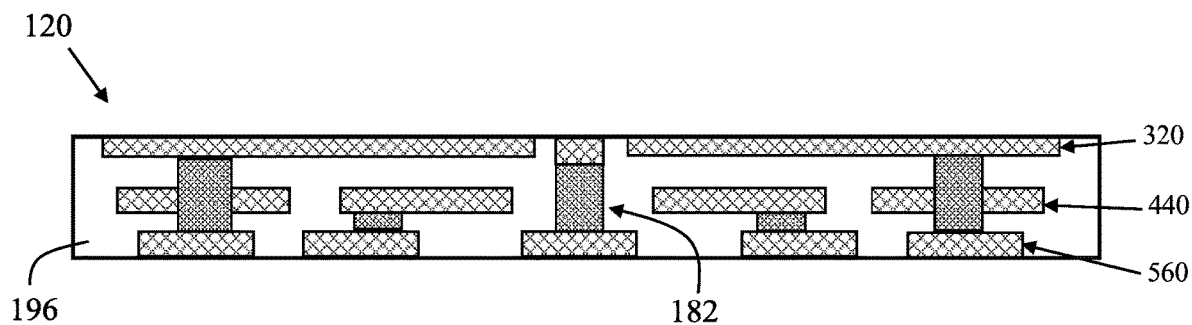
FIGS. 7, 8, 9 and 10 show cross sectional plots of steps of the process to fabricate the semiconductor package in examples of the present disclosure.

In block 602, referring now to FIG. 7, a land grid array substrate 120 is provided. The land grid array substrate 120 comprises a first metal layer 320, a second metal layer 440, a third metal layer 560, a plurality of vias 182, and a resin 196. Block 602 may be followed by block 604.

Figure 8:
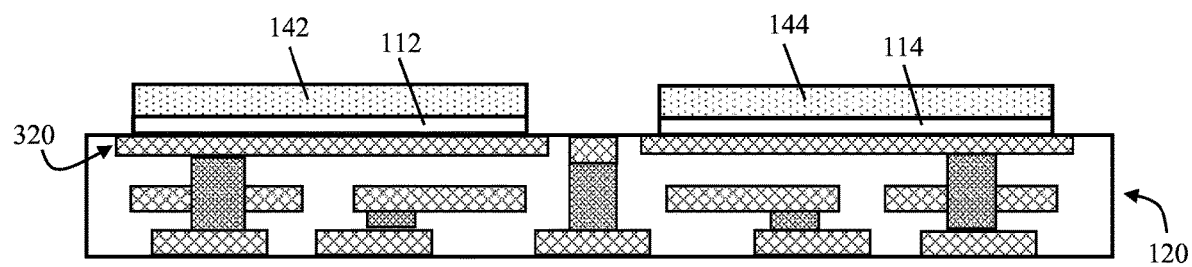
Figure 9:
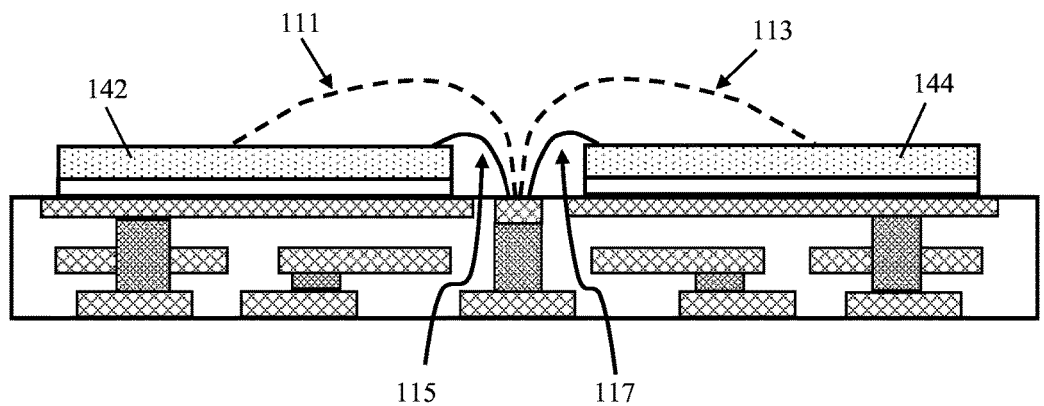

In block 604, referring now to FIG. 8, a first VDMOSFET chip 142 is attached to the first metal pad 352 of FIG. 3 of the first metal layer 320 by a first conductive adhesive 112. The second VDMOSFET chip 144 is attached to the second metal pad 354 of FIG. 3 of the first metal layer 320 by a second conductive adhesive 114. Block 604 may be followed by block 606.

In block 606, referring now to FIGS. 1A, 1B, 3, 4, 5, and 9, a wire bonding process is applied. The source electrode 162 of the first VDMOSFET chip 142 is electrically and mechanically connected to the source pad 357 of the first metal layer 320 by a bonding wire 111. The gate electrode 172 of the first VDMOSFET chip 142 is electrically and mechanically connected to the gate pad 369 of the first metal layer 320 by a bonding wire 115. The source electrode 164 of the second VDMOSFET chip 144 is electrically and mechanically connected to the source pad 357 of the first metal layer 320 by a bonding wire 113. The gate electrode 174 of the second VDMOSFET chip 144 is electrically and mechanically connected to the gate pad 369 of the first metal layer 320 by a bonding wire 117. In one example, the wire bonding process is replaced by a clip attachment process. In another example, the wire bonding process is replaced by an aluminum ribbon attachment process. Block 606 may be followed by block 608.

In block 608, referring now to FIG. 1A, a molding encapsulation 190 is formed. The molding encapsulation 190 encloses the first VDMOSFET chip 142, and the second VDMOSFET chip 144. A bottom surface of the molding encapsulation 190 is directly attached to a top surface of the resin 196. Block 608 may be followed by block 610.

Figure 10:
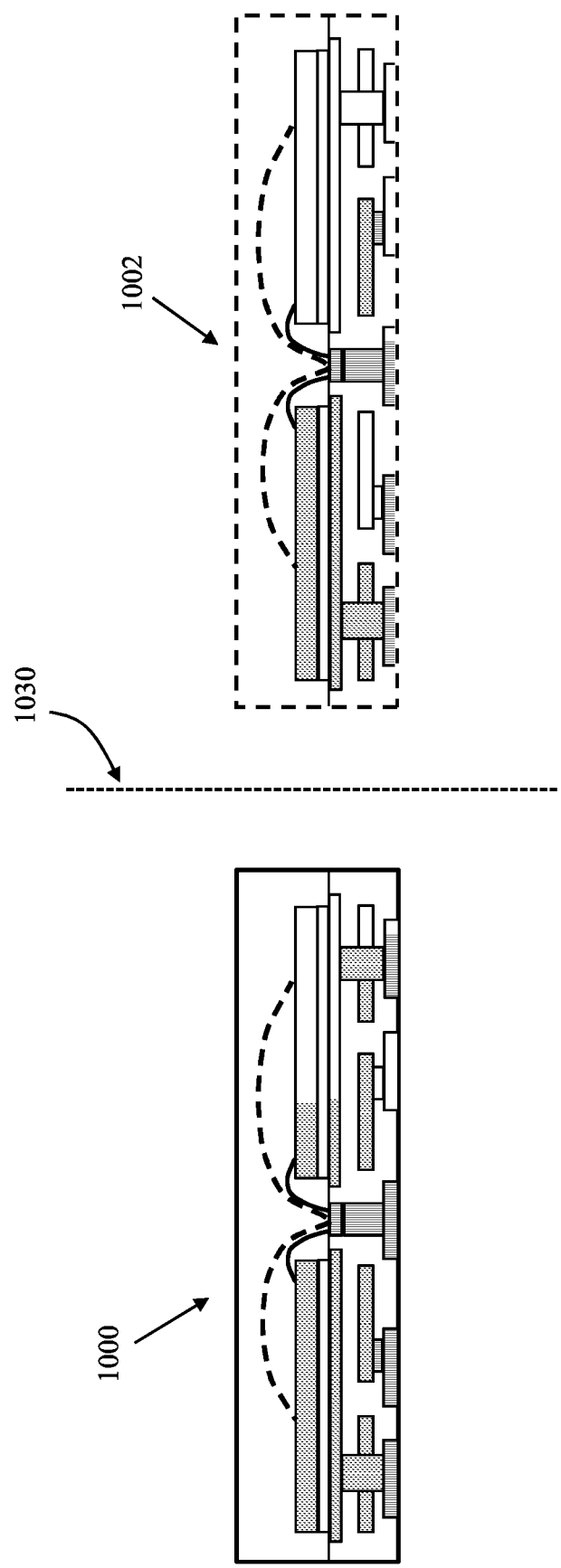

In block 610, referring now to FIG. 10, a singulation process along the line 1030 is applied. The semiconductor package 1000 is separated from an adjacent semiconductor package 1002 (shown in dashed lines). Although only two semiconductor packages are shown in FIG. 10. The number of semiconductor packages to be separated in a same sin-gulated process may vary. In one example, a strip size is 100 mm by 300 mm. Each semiconductor package size is 2 mm by 2 mm.

Those of ordinary skill in the art may recognize that modifications of the embodiments disclosed herein are possible. For example, a total number of the plurality of vias 182 may vary. Other modifications may occur to those of ordinary skill in this art, and all such modifications are deemed to fall within the purview of the present invention, as defined by the claims.

The invention claimed is:
1. A semiconductor package comprising:
   a land grid array substrate comprising
      a first metal layer;
      a second metal layer;
      a third metal layer;
      a plurality of vias; and
      a resin enclosing the second metal layer;
   a first vertical double-diffused metal-oxide semiconductor field-effect transistor (VDMOSFET) chip comprising a source electrode and a gate electrode located at a top surface of the first VDMOSFET chip and a drain electrode located at a bottom surface of the first VDMOSFET chip;
   a second VDMOSFET chip comprising a source electrode and a gate electrode located at a top surface of the first VDMOSFET chip and a drain electrode located at a bottom surface of the first VDMOSFET chip; and
   a molding encapsulation enclosing the first VDMOSFET chip and the second VDMOSFET chip;
   wherein the second metal layer is between the first metal layer and the third metal layer;
   wherein the first metal layer comprises a first metal pad, a second metal pad, a source pad, and a gate pad;
   wherein the drain electrode of the first VDMOSFET chip is attached to the first metal pad of the first metal layer by a first conductive adhesive;
   wherein the drain electrode of the second VDMOSFET chip is attached to the second metal pad of the first metal layer by a second conductive adhesive;
   wherein the source electrode of the first VDMOSFET chip is electrically connected to the source pad of the first metal layer; and the gate electrode of the first VDMOSFET chip is connected to the gate pad of the first metal layer;
   wherein the source electrode of the second VDMOSFET chip is electrically connected to the source pad of the first metal layer; and the gate electrode of the second VDMOSFET chip is electrically connected to the gate pad of the first metal layer; and
   wherein the second metal layer comprises a first letter U shaped pad and a second letter U shaped pad.

2. The semiconductor package of claim 1, wherein the first letter U shaped pad and the second letter U shaped pad forms a rotational symmetry of order two.

3. The semiconductor package of claim 1, wherein the third metal layer comprises
   a source pad;
   a gate pad;
   a first drain pad configured to be electronically connected to the drain electrode of the first VDMOSFET chip;
   a second drain pad configured to be electronically connected to the drain electrode of the second VDMOSFET chip;
   a third drain pad configured to be electronically connected to the drain electrode of the first VDMOSFET chip; and a fourth drain pad configured to be electronically connected to the drain electrode of the second VDMOSFET chip.

4. The semiconductor package of claim 3, wherein the second drain pad is between the first drain pad and the third drain pad; and
wherein the third drain pad is between the second drain pad and the fourth drain pad.

5. The semiconductor package of claim 4, wherein the source pad of the third metal layer is between the second drain pad and the third drain pad; and
wherein the gate pad of the third metal layer is between the second drain pad and the third drain pad.

6. The semiconductor package of claim 5, wherein the first metal pad of the first metal layer, the first letter U shaped pad of the second metal layer, and the first drain pad of the third metal layer are connected by a first plurality of vias;
wherein the first letter U shaped pad of the second metal layer and the third drain pad of the third metal layer are connected by a second plurality of vias;
wherein the second metal pad of the first metal layer, the second letter U shaped pad of the second metal layer, and the fourth drain pad of the third metal layer are connected by a third plurality of vias; and
wherein the second letter U shaped pad of the second metal layer and the second drain pad of the third metal layer are connected by a fourth plurality of vias.

7. The semiconductor package of claim 6, wherein the source pad of the first metal layer and the source pad of the third metal layer are connected by one or more source vias; and
wherein the gate pad of the first metal layer and the gate pad of the third metal layer are connected by one or more gate vias.

8. The semiconductor package of claim 3, wherein the first drain pad, the second drain pad, the third drain pad, and the fourth drain pad have a same size.

9. The semiconductor package of claim 8, wherein a bottom surface of the source pad of the third metal layer is of a circular shape; and
wherein a bottom surface of the gate pad of the third metal layer is of the circular shape.

10. The semiconductor package of claim 1, wherein a bottom surface of the molding encapsulation is directly attached to a top surface of the resin.

11. A semiconductor package comprising:
a land grid array substrate comprising
a first metal layer;
a second metal layer;
a third metal layer;
a plurality of vias; and
a resin enclosing the second metal layer;
a first metal-oxide semiconductor field-effect transistor (MOSFET) chip;
a second MOSFET chip; and
a molding encapsulation enclosing the first MOSFET chip, and the second MOSFET chip;
wherein the second metal layer comprises a first letter U shaped pad and a second letter U shaped pad.

12. The semiconductor package of claim 11, wherein the first letter U shaped pad and the second letter U shaped pad forms a rotational symmetry of order two.

13. The semiconductor package of claim 11, wherein the third metal layer comprises
a source pad;
a gate pad;
a first drain pad configured to be electronically connected to a drain electrode of the first MOSFET chip;
a second drain pad configured to be electronically connected to a drain electrode of the second MOSFET chip;
a third drain pad configured to be electronically connected to the drain electrode of the first MOSFET chip; and
a fourth drain pad configured to be electronically connected to the drain electrode of the second MOSFET chip.

14. The semiconductor package of claim 13, wherein the second drain pad is between the first drain pad and the third drain pad; and
wherein the third drain pad is between the second drain pad and the fourth drain pad.

15. The semiconductor package of claim 13, wherein the first drain pad, the second drain pad, the third drain pad, and the fourth drain pad have a same size.

16. The semiconductor package of claim 15, wherein a bottom surface of the source pad of the third metal layer is of a circular shape; and
wherein a bottom surface of the gate pad of the third metal layer is of the circular shape.

17. The semiconductor package of claim 1, wherein a top surface of the first metal layer is coplanar;
wherein a bottom surface of the first metal layer is coplanar;
wherein a top surface of the second metal layer is coplanar;
wherein a bottom surface of the second metal layer is coplanar;
wherein a top surface of the third metal layer is coplanar;
wherein a bottom surface of the third metal layer is coplanar; and
wherein the second metal layer is between the first metal layer and the third metal layer.

* * * * *